United States Patent
Huang

(10) Patent No.: US 6,699,754 B2
(45) Date of Patent: Mar. 2, 2004

(54) FLASH MEMORY CELL AND METHOD FOR FABRICATING THE SAME

(75) Inventor: Yung-Meng Huang, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/302,285

(22) Filed: Nov. 22, 2002

(65) Prior Publication Data

US 2003/0201489 A1 Oct. 30, 2003

(30) Foreign Application Priority Data

Apr. 24, 2002 (TW) ........................................ 91108472 A

(51) Int. Cl.⁷ ...................... H01L 21/8242; H01L 21/00
(52) U.S. Cl. ........................ 438/257; 438/269; 438/266; 438/962; 438/979
(58) Field of Search ................................ 438/594, 260, 438/263, 167, 927, 962, 979, 269, 257, 266, 680, 197, 211, 166, 596; 257/316, 317, 318

(56) References Cited

U.S. PATENT DOCUMENTS

| | | | | |
|---|---|---|---|---|
| 5,712,208 A | * | 1/1998 | Tseng et al. | 438/770 |
| 6,117,756 A | * | 9/2000 | Wu | 438/594 |
| 6,297,095 B1 | * | 10/2001 | Muralidhar et al. | 438/257 |
| 6,310,376 B1 | * | 10/2001 | Ueda et al. | 257/315 |
| 6,330,184 B1 | * | 12/2001 | White et al. | 365/185.03 |
| 6,344,403 B1 | * | 2/2002 | Madhukar et al. | 438/503 |
| 6,410,412 B1 | * | 6/2002 | Taira et al. | 438/594 |
| 6,455,890 B1 | * | 9/2002 | Chang et al. | 257/321 |
| 6,461,905 B1 | * | 10/2002 | Wang et al. | 438/183 |
| 6,589,844 B2 | * | 7/2003 | Tanigami | 438/261 |
| 6,614,072 B2 | * | 9/2003 | Sandhu et al. | 257/317 |
| 6,617,639 B1 | * | 9/2003 | Wang et al. | 257/324 |
| 6,656,792 B2 | * | 12/2003 | Choi et al. | 438/257 |
| 6,657,253 B2 | * | 12/2003 | Kwon et al. | 257/321 |

* cited by examiner

Primary Examiner—Michael S. Lebentritt
(74) Attorney, Agent, or Firm—Nelson A. Quintero

(57) ABSTRACT

A flash memory cell. The memory cell includes a substrate, a floating gate, a control gate, and a source/drain region. The floating gate, disposed over the substrate and insulated from the substrate, has a plurality of hut structures. The control gate is disposed over the floating gate and insulated from the floating gate. The source/drain region is formed in the substrate. This invention further includes a method of fabricating a flash memory cell. First, a polysilicon layer and a germanium layer are successively formed over a substrate and insulated from the substrate. Subsequently, the substrate is annealed to form a germanium layer having a plurality of hut structures on the polysilicon layer to serve as a floating gate with the polysilicon layer. Next, a control gate is formed over the floating gate and insulated from the floating gate. Finally, a source/drain region is formed in the substrate.

7 Claims, 7 Drawing Sheets

FLASH MEMORY CELL AND METHOD FOR FABRICATING THE SAME

BACKGROUND OF THE INVENTION

1. Field of the Invention

The present invention relates in general to a memory cell. More particularly, it relates to a flash memory cell and method for fabricating the same to reduce erase voltage and the size of the memory cell.

2. Description of the Related Art

Non-volatile memory, such as flash memory, stores data regardless of electrical power supplied, and reads and writes data by controlling a threshold voltage of a control gate. Conventionally, flash memory includes a floating gate and a control gate. The floating gate stores charge and the control gate reads and writes data. In addition, the floating gate is located under the control gate and is not connected to external circuit, and the control gate connects to the word line. Since flash memory has a high operating speed, it is widely applied for consumer electronics devices, such as digital cameras, mobile phones, personal stereos, and laptops.

FIGS. 1A–1F are cross-sections showing a conventional method of fabricating a split gate flash memory cell.

First, in FIG. 1A, a silicon substrate 10 is provided, and a thin silicon oxide layer 12 is formed thereon serving as a tunnel oxide layer. The tunnel oxide layer 12 can be formed by thermal oxidation and has a thickness of about 80 Å. Next, a polysilicon layer 14 having a thickness of about 1200 Å and a silicon nitride layer 16 having a thickness of about 800 Å are successively deposited on the tunnel oxide layer 12.

Next, in FIG. 1B, a photoresist layer 18 is coated on the silicon nitride layer 16, leaving a portion exposed. Thereafter, the exposed portion of the silicon nitride layer 16 is etched to form an opening 20 exposing the polysilicon layer 14. Thereafter, ion implantation is performed to dope boron ions B into the substrate 10 through the opening 20 to form a channel doping region 22.

Next, in FIG. 1C, the photoresist layer 18 is stripped and thermal oxidation is performed on the exposed polysilicon layer 14 using the remaining silicon nitride layer 16a as a mask to form a thick oxide layer 24 having tipped and thin portions 24a, 24b at its edge in the opening 20.

Next, in FIG. 1D, the remaining silicon nitride layer 16a is removed by wet etching to expose the polysilicon layer 14.

Next, in FIG. 1E, the polysilicon layer 14 is etched by anisotrpically etching, using thick oxide layer 24 as a mask to the tunnel oxide layer 12. The remaining polysilicon layer 14a is used as a floating gate.

Finally, in FIG. 1F, a gate dielectric layer 28, a control gate 30, and source region S/drain region D are formed to finish the fabrication of the split gate flash memory cell.

However, the conventional flash memory cell cannot increase integration of ICs, due to its larger size. Moreover, using the tip portions 24a, 24b of the floating gate 14 to eliminate hot electrons from the floating gate 14 for erasing cannot effectively reduce the erase voltage, such as 10.5 V, due to fewer discharging paths.

SUMMARY OF THE INVENTION

Accordingly, an object of the invention is to provide a novel flash memory cell to increase the integration of ICs by reducing the size of the flash memory cell.

Another object of the invention is to provide a novel method of fabricating a flash memory cell to reduce the erase voltage by forming a floating gate having a plurality of hut structures.

According to one aspect, this invention provides a flash memory cell. The memory cell includes a substrate, a floating gate, a control gate and a source/drain region. The floating gate having a plurality of hut structures is disposed over the substrate and insulated from the substrate. The control gate is disposed over the floating gate and insulated from the floating gate. The source/drain region is formed in the substrate. A cap layer is disposed on the control gate and an insulating spacer is disposed over the sidewall of the control gate and floating gate.

The floating gate can be polysilicon and germanium and the control gate can be polysilicon. Moreover, the cap layer can be undoped silicate glass and the insulating spacer can be silicon nitride.

According to another aspect, this invention provides a method of fabricating a flash memory cell. First, a polysilicon layer and a germanium layer are successively formed over a substrate and insulated from the substrate. Subsequently, the substrate is annealed to form a germanium layer having a plurality of hut structures on the polysilicon layer to serve as a floating gate with the polysilicon layer. Next, a control gate is formed over the floating gate and insulated from the floating gate. Finally, a source/drain region is formed in the substrate.

The germanium layer having a thickness of about 500~1000 Å is formed by physical vapor deposition (PVD). Moreover, annealing is performed at about 550° C.~650° C. for 3~5 minutes.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

A preferred embodiment of the present invention is now described with reference to FIGS. 2A–2F and FIG. 3.

Figure 1A:
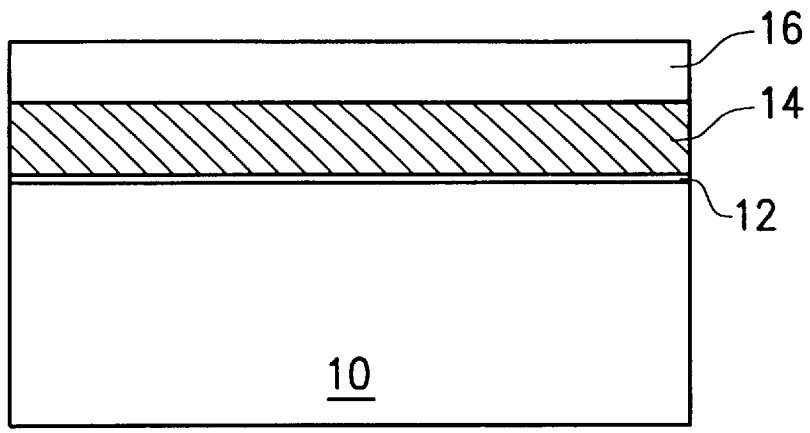
FIGS. 1A–1F are cross-sections showing a conventional method of fabricating a flash memory cell.
Figure 1B:
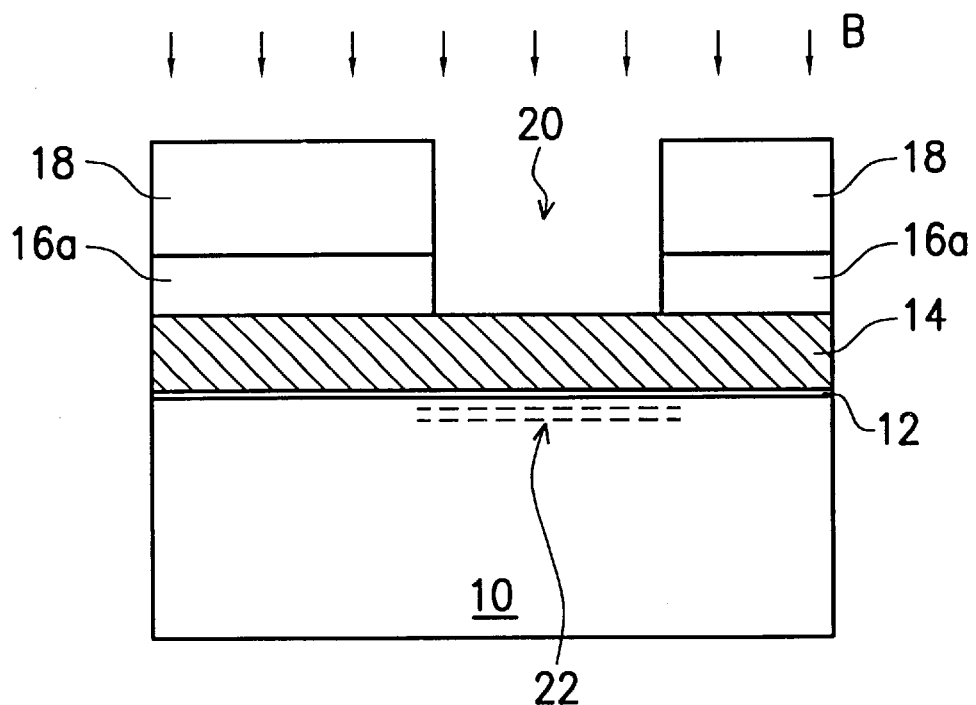
Figure 1C:
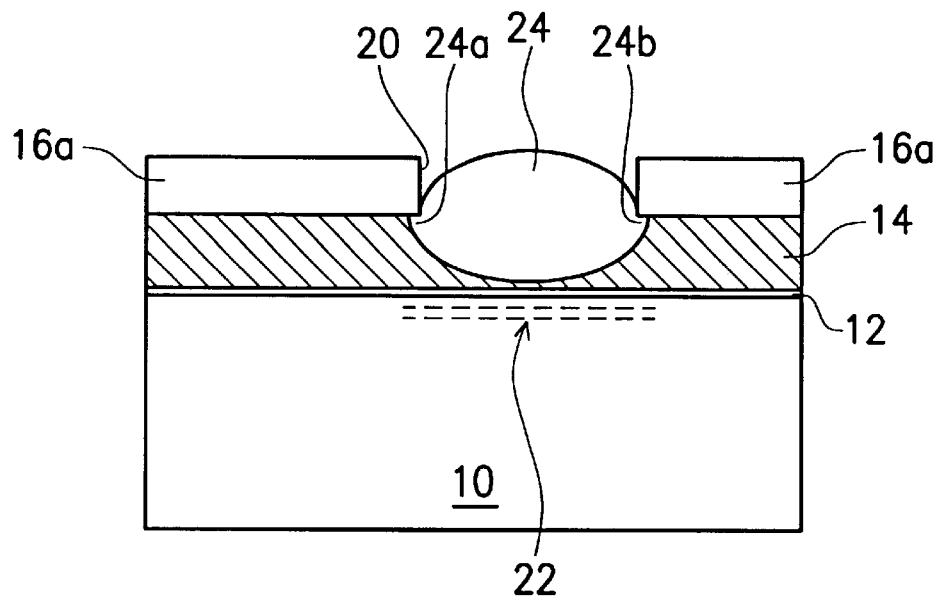
Figure 1D:
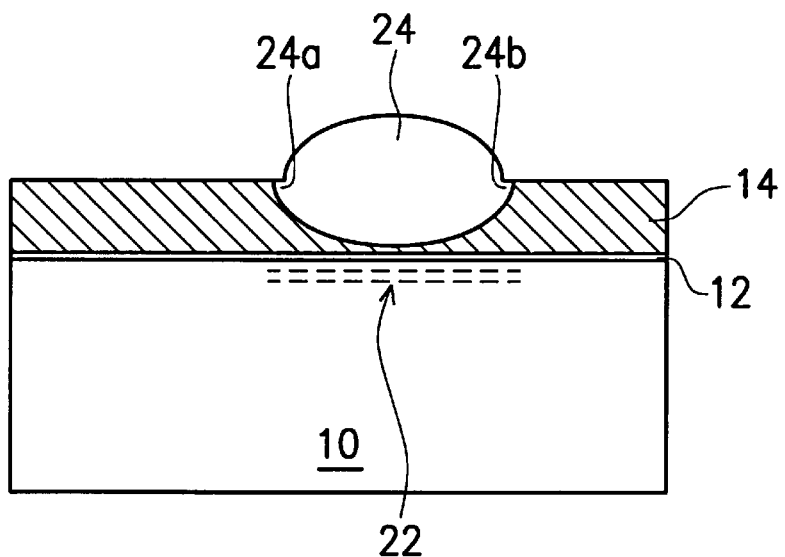
Figure 1E:
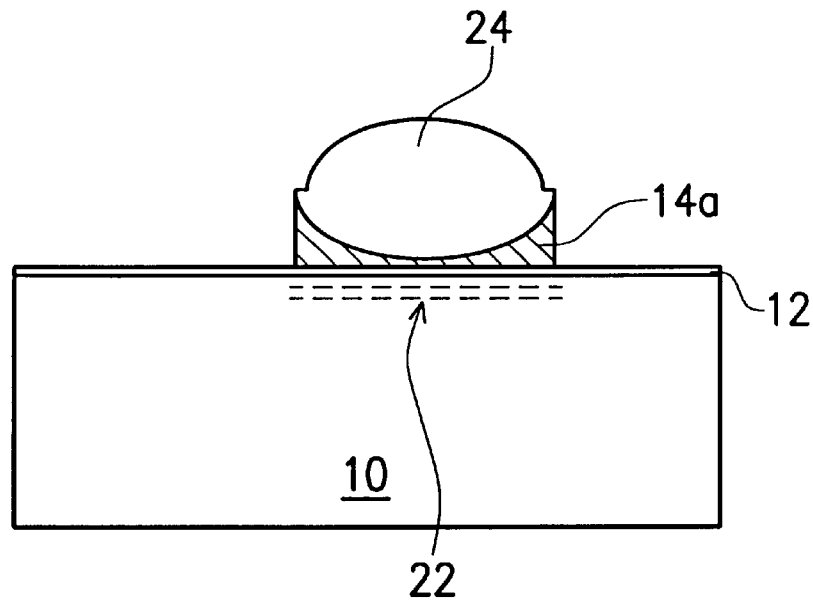
Figure 1F:
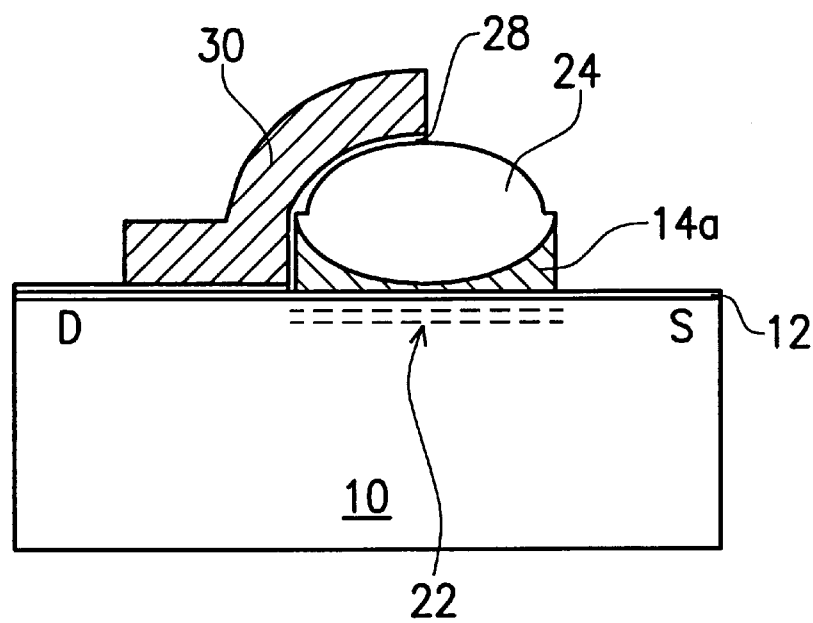
Figure 2A:
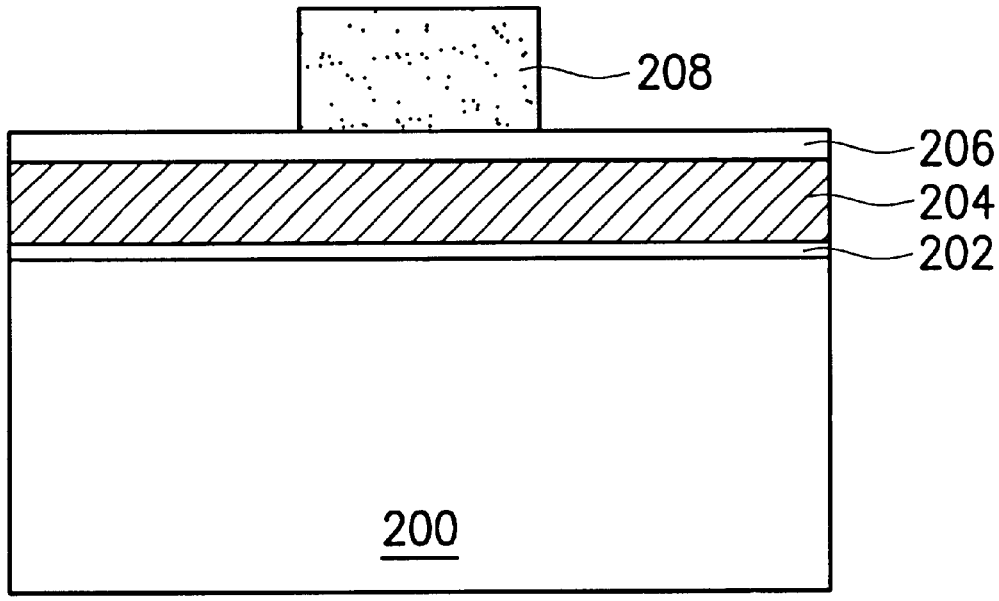
FIGS. 2A–2F are cross-sections showing a method of fabricating a flash memory cell according to the present invention.

First, in FIG. 2A, a substrate 200, such as a silicon substrate, is provided. Next, a thin oxide layer 202 is formed on the substrate 200 to serve as a tunnel oxide layer. In this invention, the thin oxide layer 202, for example, can be formed by thermal oxidation in $O_2$ atmosphere. The thin oxide layer 202 has a thickness of about 40~90 Å. Thereafter, a polysilicon layer 204 and a germanium layer 206 are successively formed over the substrate 200. In this invention, the polysilicon layer 204 having a thickness of about 1000~1500 Å is formed by conventional deposition, such as chemical vapor deposition (CVD). Moreover, the germanium layer 206 having a thickness of about 500~1000 Å can be formed by physical vapor deposition (PVD). Next, a patterned photoresist layer 208 is formed on the germanium layer 206 by lithography, leaving a portion exposed.

Figure 2B:
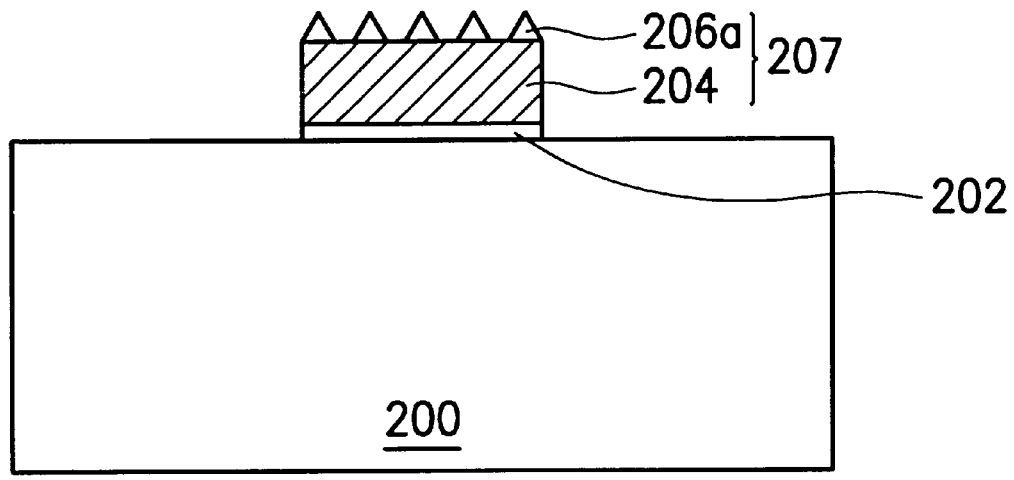

Next, in FIG. 2B, the germanium layer 206 uncovered by the patterned photoresist layer 208 and the underlying polysilicon layer 204 and oxide layer 202 are removed by anisotropic etching, such as dry etching, to expose the substrate 200. Next, the patterned photoresist layer 208 can be striped by wet etching or ashing. After the patterned photoresist layer 208 is striped, a critical step of the invention is performed. The substrate 200 is annealed to form a germanium layer having a plurality of hut structures 206a on the polysilicon layer 204. The germanium layer having a plurality of hut structures 206a and polysilicon layer serve as a floating gate 207 and are insulated from the substrate 200 by oxide layer 202. In this invention, annealing is performed at about 550° C.~650° C. for 3~5 minutes.

Figure 3:
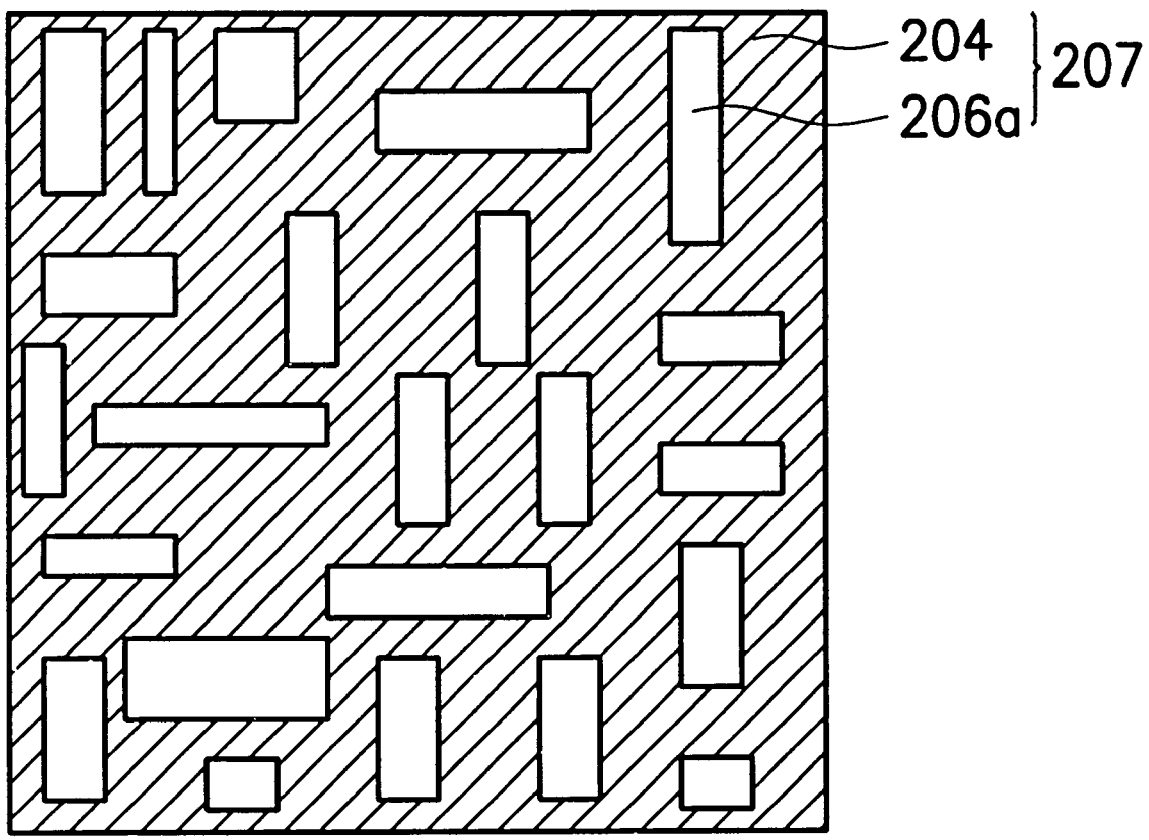
FIG. 3 illustrates a partial plane view according to FIG. 2B.

FIG. 3 illustrates a partial plane view in FIG. 2B. Since the lattice mismatch between the germanium atoms and silicon atoms, the germanium layer having a plurality of hut structures 206a are formed and irregularly distributed on the polysilicon layer 204 after annealing.

Figure 2C:
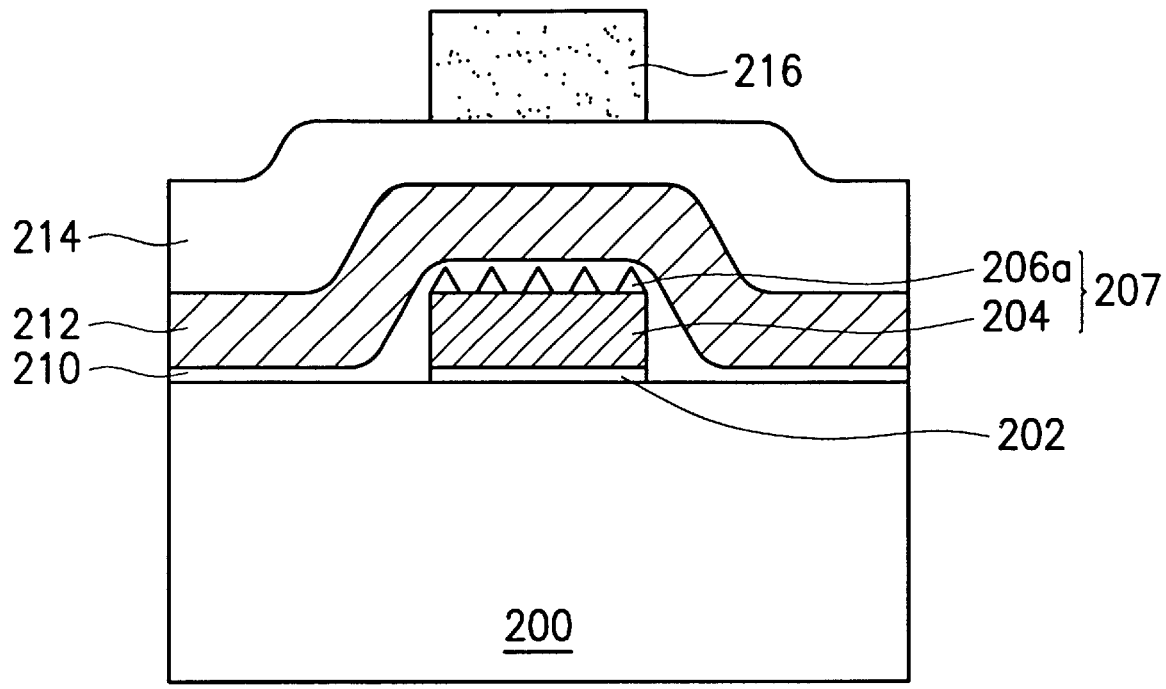

In FIG. 2C, an oxide layer 210, a polysilicon layer 212, and an undoped silicate glass (USG) layer 214 are successively formed on the floating gate 207. In this invention, those layers 210, 212, and 214 can be formed by conventional deposition, such as CVD. Moreover, the oxide layer 210 has a thickness of about 200~300 Å and the USG layer 214 has a thickness of about 2000~2500 Å. Next, a patterned photoresist layer 216 is formed on the USC layer 214 by lithography, leaving a portion exposed.

Figure 2D:
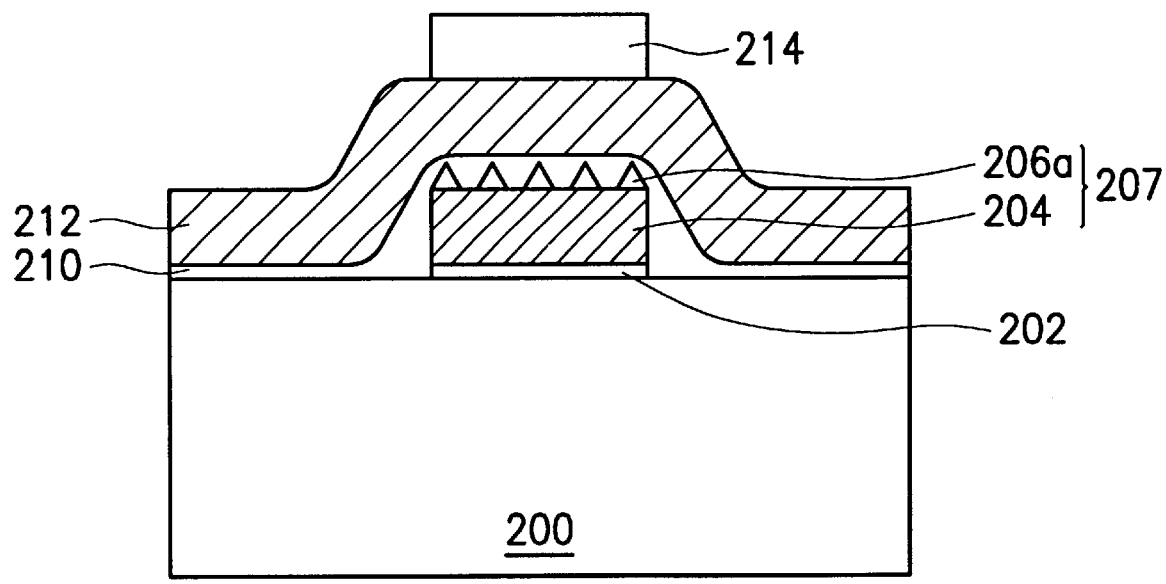

Next, in FIG. 2D, the USG layer 214 uncovered by the patterned photoresist layer 216 is etched to expose the polysilicon layer 212. Thereafter, the patterned photoresist layer 216 is stripped by wet etching or ashing.

Figure 2E:
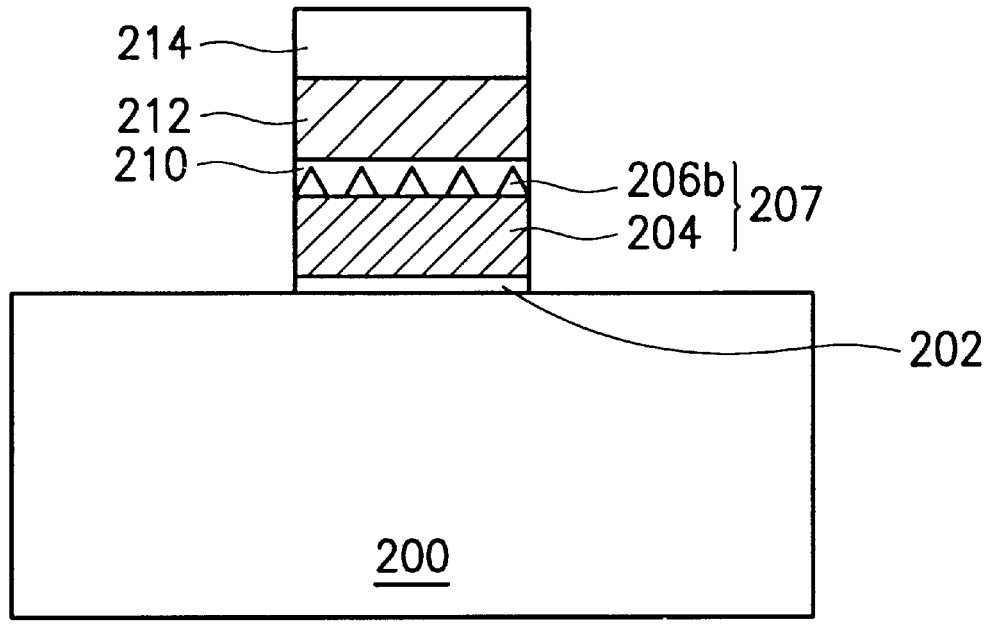
Figure 2F:
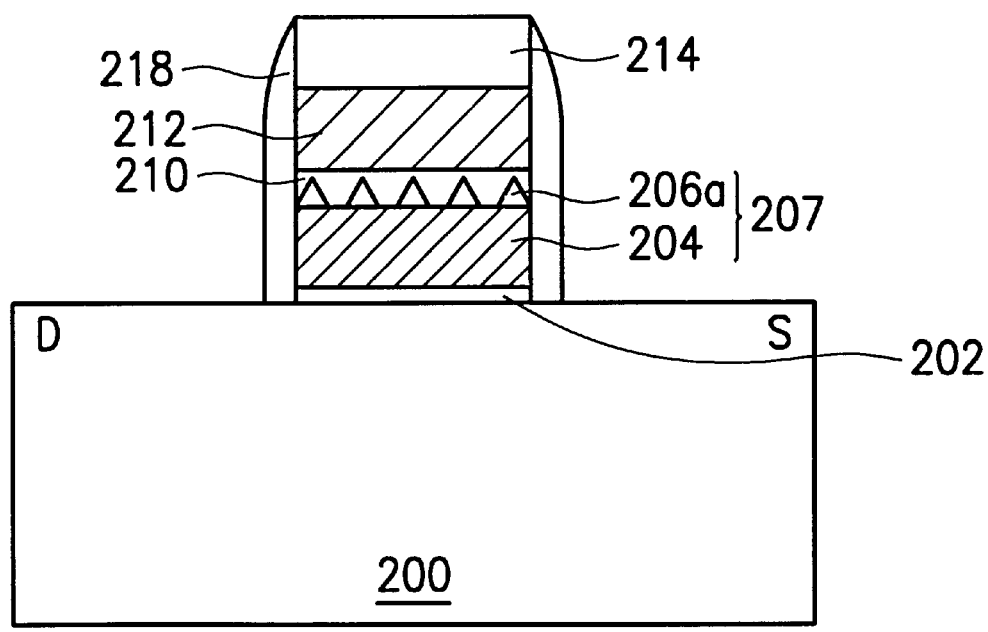

Next, in FIG. 2E, the polysilicon layer 212 and the oxide layer 210 are successively etched using the remaining USG layer 214 as a hard mask. The remaining polysilicon layer 212 over the floating gate 207 serves as a control gate 212 and is insulated from the floating gate 212 by the remaining oxide layer 210. In addition, the remaining USG layer 214 on the control gate 212 is used as a cap layer.

Finally, a conformable silicon nitride layer (not shown) is deposited on the substrate according to the FIG. 2E by conventional deposition, such as CVD. Next, the silicon nitride layer is anisotropically etched by dry etching to form an insulating spacer 218 over the sidewall of the control gate 212 and the floating gate 207. Thereafter, source region S and drain region D (source/drain region) are formed in the substrate 200 of the outside insulating spacer 218 by ion implantation, thus the fabrication of a split gate flash memory cell according to the invention is completed.

Compared with the prior art, the floating gate according to the invention can provide more discharging paths through tip portions of the hut structures formed by annealing a germanium layer. Accordingly, electrons can be eliminated easily from the floating gate during erasing. That is, erase voltage applied to the control gate can be lowered, for example, below 9V. Moreover, since the control gate of the split gate flash memory according to the invention is completely formed over the floating gate, the size of the flash memory cell, compared with the prior art, can be reduced to increase integration of ICs.

The foregoing description has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A flash memory cell, comprising:
   a substrate;
   a floating gate having a plurality of hut structures disposed over the substrate and insulated from the substrate;
   a control gate disposed over the floating gate and insulated from the floating gate; and
   a source/drain region formed in the substrate.

2. The cell as claimed in claim 1, wherein the substrate is silicon.

3. The cell as claimed in claim 1, wherein the floating gate is polysilicon and germanium.

4. The cell as claimed in claim 1, wherein the control gate is polysilicon.

5. The cell as claimed in claim 1, further comprising:
   a cap layer disposed on the control gate; and
   an insulating spacer disposed over the sidewall of the control gate and floating gate.

6. The cell as claimed in claim 5, wherein the cap layer is undoped silicate glass.

7. The cell as claimed in claim 5, wherein the insulating spacer is silicon nitride.

* * * * *